United States Patent
Yamaguchi

(10) Patent No.: US 7,875,894 B2
(45) Date of Patent: Jan. 25, 2011

(54) SEMICONDUCTOR DEVICE AND FABRICATION METHOD THEREOF

(75) Inventor: Tadashi Yamaguchi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 1 day.

(21) Appl. No.: 11/543,196

(22) Filed: Oct. 5, 2006

(65) Prior Publication Data

US 2007/0085182 A1    Apr. 19, 2007

(30) Foreign Application Priority Data

Oct. 14, 2005   (JP) ............... 2005-300576

(51) Int. Cl.
    *H01L 23/48* (2006.01)
(52) U.S. Cl. ............... 257/95; 357/E33.068; 357/738
(58) Field of Classification Search ............... 257/738, 257/E23.069, 95
    See application file for complete search history.

(56) References Cited

U.S. PATENT DOCUMENTS

| | | | |
|---|---|---|---|
| 5,316,788 A * | 5/1994 | Dibble et al. ............... 430/314 |
| 5,634,268 A * | 6/1997 | Dalal et al. ............... 29/840 |
| 5,672,260 A * | 9/1997 | Carey et al. ............... 205/118 |
| 6,228,466 B1 * | 5/2001 | Tsukada et al. ............... 428/209 |
| 6,335,571 B1 * | 1/2002 | Capote et al. ............... 257/787 |
| 6,563,216 B1 * | 5/2003 | Kimura et al. ............... 257/737 |
| 6,573,598 B2 * | 6/2003 | Ohuchi et al. ............... 257/734 |
| 6,809,415 B2 * | 10/2004 | Tsukada et al. ............... 257/693 |
| 2003/0203612 A1 * | 10/2003 | Akram et al. ............... 438/612 |

FOREIGN PATENT DOCUMENTS

JP    2000-353766    12/2000

* cited by examiner

*Primary Examiner*—Bradley K Smith
*Assistant Examiner*—Alexander Belousov
(74) *Attorney, Agent, or Firm*—Volentine & Whitt, P.L.L.C.

(57) ABSTRACT

A semiconductor device includes a semiconductor chip having electrode pads, and a rewiring pattern having interconnects which are connected to the electrode pads and extend over an insulation film. The semiconductor device also includes columnar electrodes each of which has a main body section and a protrusion section, and a sealing section which has a top face having a height the same as the top faces of the protrusion sections. The semiconductor device also includes solder balls formed on the protrusion sections. The semiconductor device also has trenches in the sealing section. Each trench has a depth which reaches the boundary between the main body and protrusion of the electrode. The side faces of the protrusion section are exposed face defined by the trenches. Each solder ball is electrically connected to the top face and side faces of the protrusion section of each electrode.

6 Claims, 10 Drawing Sheets

SEMICONDUCTOR DEVICE AND FABRICATION METHOD THEREOF

BACKGROUND OF THE INVENTION

1. Field of the Invention

The present invention relates to a semiconductor device having a so-called W-CSP (Wafer Level Chip Size Package) and a fabrication method thereof.

2. Description of the Related Art

A semiconductor chip package, of which size is almost equal to that of a semiconductor chip diced from a semiconductor wafer, is generally called a CSP (Chip Size Package). A CSP created by packaging a semiconductor chip having predetermined functions formed in a semiconductor wafer, in semiconductor wafer status, and then dicing it into an individual chip, in particular is called a W-CSP.

In such CSPs, an external terminal is a columnar electrode (post-like electrode) or a combination of a columnar electrode and a solder ball. The solder ball is connected to the top face of the columnar electrode.

If the electrode terminal is a columnar electrode having a solder ball thereon, an alloy portion is inevitably formed by the reaction of the metal materials of the electrode (post) and solder ball when the solder ball is bonded on top of the electrode. This alloy portion is formed in several tens μm in height, along the bonding face (interface) between the columnar electrode and solder ball.

In this alloy portion, the strength (bonding strength) of the bonding face against stress becomes somewhat weaker. In some cases, peeling and cracking are generated in the alloy portion (bonding face) in the temperature cycle test after bonding, for example, and the solder ball falls from the columnar electrode.

Japanese Patent Application Kokai (Laid-Open) No. 2000-353766 discloses a CSP having column electrodes and solder balls on the top faces thereof and a fabrication method for such CSP. Japanese Patent Application Kokai No. 2000-353766 provides a CSP having high connection reliability and a fabrication method thereof. Specifically, the bonding strength is improved by exposing the entire top face and a part of the lateral wall of the columnar electrode from the sealing resin, and covering a part of the exposed lateral wall with a solder ball.

The number of external terminals (solder balls) formed on the packaging face of the CSP, that is the number of pins, is decided by the size of the packaging face and the pitch of the external terminals (distance between two adjacent external terminals). As the size of the packaging face increases or as the pitch of the external terminals decreases, the number of pins on the packaging face increases. An increase in the number of pins on the packaging face is called an "increase of pins" here.

In order to increase pins by decreasing the pitch of the external terminals, each external terminal, that is the diameters of the columnar electrode and solder ball, should be downsized.

In Japanese Patent Application Kokai No. 2000-353766, the area of the bonding face of the columnar electrode and solder ball is increased to improve the bonding strength thereof, but the diameter of the solder ball increases. This makes it difficult to implement an increase of pins.

SUMMARY OF THE INVENTION

It is one object of the present invention to provide a semiconductor device having a W-CSP structure which can increase pins while improving the bonding strength of the columnar electrodes and solder balls, without increasing the diameter of the solder ball (or the diameter of the external terminal).

Another object of the present invention is to provide a simple fabrication method for such semiconductor device.

According to a first aspect of the present invention, there is provided a semiconductor device that includes a semiconductor chip having a plurality of electrode pads formed on one main surface of the semiconductor chip. An insulation film is formed on the main surface such that a top face of each electrode pad is exposed. The semiconductor device has a rewiring pattern. The rewiring pattern has a plurality of interconnects which are connected to the electrode pads respectively, and extend over the insulation film. A plurality of electrodes (posts) are connected to the interconnects, respectively and stand in a direction perpendicularly to the main surface of the semiconductor chip. For example, each electrode has a generally column shape. Each electrode has a main body section, and a protrusion section upwardly extending from the main body section. A sealing section is formed on the rewiring pattern and insulation film, and buries the columnar electrodes. The top face of the sealing section is coplanar to the top faces of the protrusion sections of the columnar electrodes. A plurality of trench sections are formed in the sealing section. Side faces of the protrusion sections are exposed by the trench sections. Each trench has a depth from the top face of the sealing section to the boundary between the protrusion section and main body section of the electrode. A solder ball is formed at the protrusion section of each electrode, and is electrically connected with the electrode. The solder ball is connected to the top face and side faces of the protrusion section of each electrode.

According to this semiconductor device, the column-shaped electrode itself is cut from the top face, and the protrusion section and trench (or recess) are formed in the column-shaped electrode. At the same time, part of the sealing section is also removed so that side faces of the protrusion section are exposed. Thus, the top face and side faces of the protrusion section can be used as a bonding face. Accordingly, the shape of the bonding face between the electrode and solder ball becomes more complicated and the bonding area is increased. Therefore, the bonding strength between the electrode and solder ball can be dramatically improved. Also the diameter of the solder ball is not increased by this, so that a further increase in pins can be implemented.

It should be noted that instead of the trench sections, there may be formed a recess in the top of the protrusion of each electrode. At least part of the solder ball is received in the recess when the solder ball is attached to the electrode. The recess increases the bonding area between the electrode and solder ball so that the bonding strength between the electrode and solder ball is increased.

According to a second aspect of the present invention, there is provided a fabrication method for a semiconductor device that has the following steps.

A semiconductor substrate, on which circuit elements are formed in each semiconductor chip formation area, is prepared. A plurality of electrode pads are connected to the circuit elements and provided on one main surface of the substrate. An insulation film is formed on the main surface of the substrate such that a part of the electrode pads is exposed from the insulation film. A rewiring pattern having a plurality of interconnects, which are connected to the electrode pads, is formed on the insulation film. A plurality of preliminary columnar electrodes, which stand perpendicularly to the main surface of the substrate, are formed. The preliminary columnar electrodes are connected to the interconnects respectively. A sealing section, which buries the rewiring pattern and preliminary columnar electrodes and has a top face having the same height as the top faces of the preliminary columnar electrodes, is formed on the insulation film. Columnar electrodes are made from the preliminary electrodes by forming trenches. Each electrode has a main body section and a protrusion section formed by the trenches. The protrusion section extends upward from the main body section. Side faces of the protrusion sections are exposed by the trenches. The trenches are formed by removing a part of the preliminary columnar electrodes (and the sealing section, when necessary) with a predetermined depth from the top face of the preliminary columnar electrode. A solder ball is attached to each protrusion. The solder ball covers the protrusion section and is electrically connected to the top face and side faces of the protrusion section. Then, the semiconductor substrate is diced into individual semiconductor chips.

According to this fabrication method of the semiconductor device, the trench section can be formed by a simple cutting process using a blade, such as a dicing saw of a dicing device, for example, so that a semiconductor device having the above described advantages can be fabricated efficiently.

These and other objects, aspects and advantages of the present invention will become apparent to those skilled in the art from the following detailed description and appended claims when read and understood in conjunction with the accompanying drawings.

DETAILED DESCRIPTION OF THE INVENTION

Figure 1A:
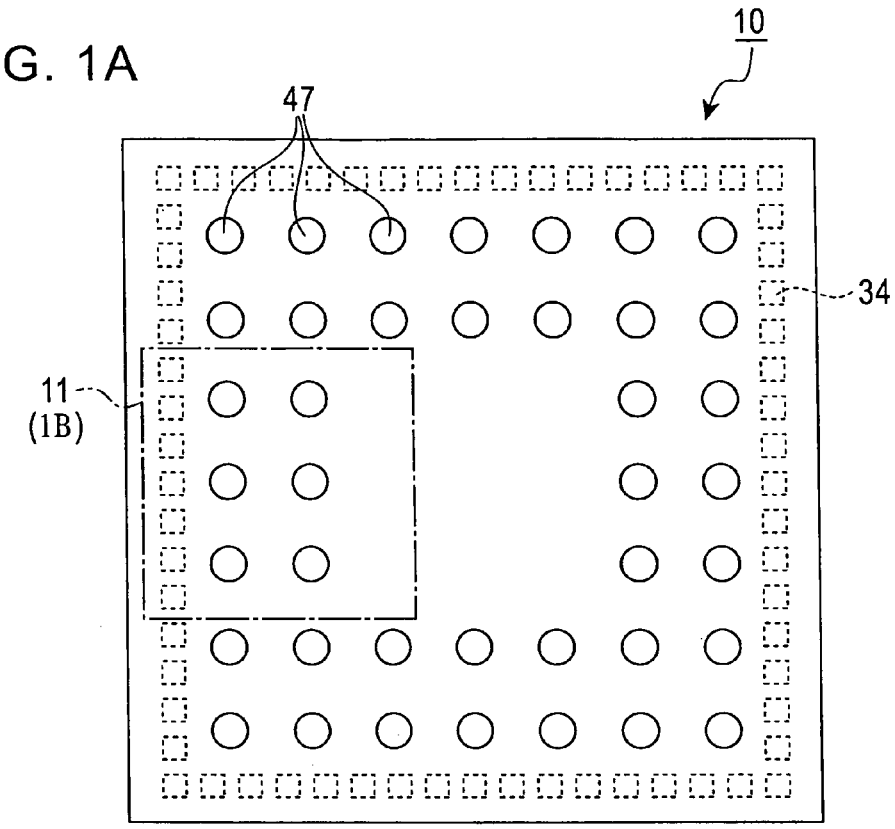
FIG. 1A is a plan view of a semiconductor device according to a first embodiment of the present invention.

Embodiments of the present invention will now be described with reference to the drawings. In the drawings, the shape, size and positional relationship of each composing element are shown simply to assist understanding the present invention, but the present invention is not limited to this. Also in the following description, specific materials, conditions and numeric values may be used, but these are merely examples in preferred embodiments, and the present invention is not limited to them. The same or similar composing elements in the different drawings are denoted with the same reference numerals and symbols, and redundant description thereof may be omitted.

First Embodiment

The configuration of the semiconductor device 10 according to the first embodiment will now be described with reference to FIGS. 1A, 1B, 2A and 2B.

Figure 1B:
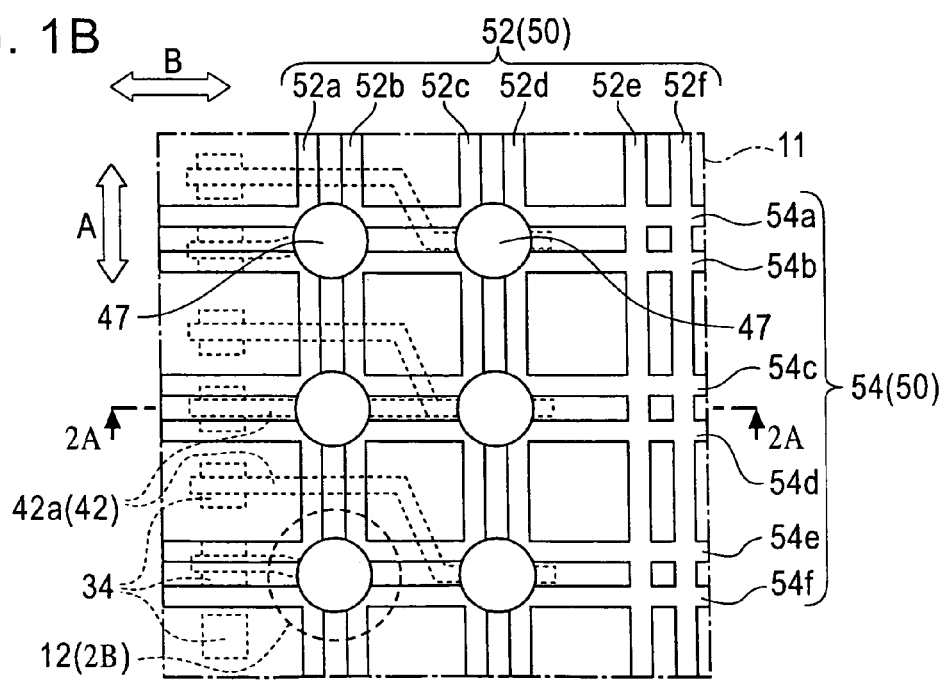
FIG. 1B is an enlarged plan view of the semiconductor device of FIG. 1A, depicting major parts in a first partial area enclosed by the solid line in FIG. 1A.

FIG. 1B is an enlarged plan view depicting the detail of the first partial area 11 enclosed by the solid line in FIG. 1A. FIG. 2B is an enlarged plan view depicting the detail of the second partial area 12 indicated by the dotted line in FIG. 1B. In FIG. 2B, the solder ball 47, which actually exists, is omitted to describe the structure below the solder ball.

Figure 2A:
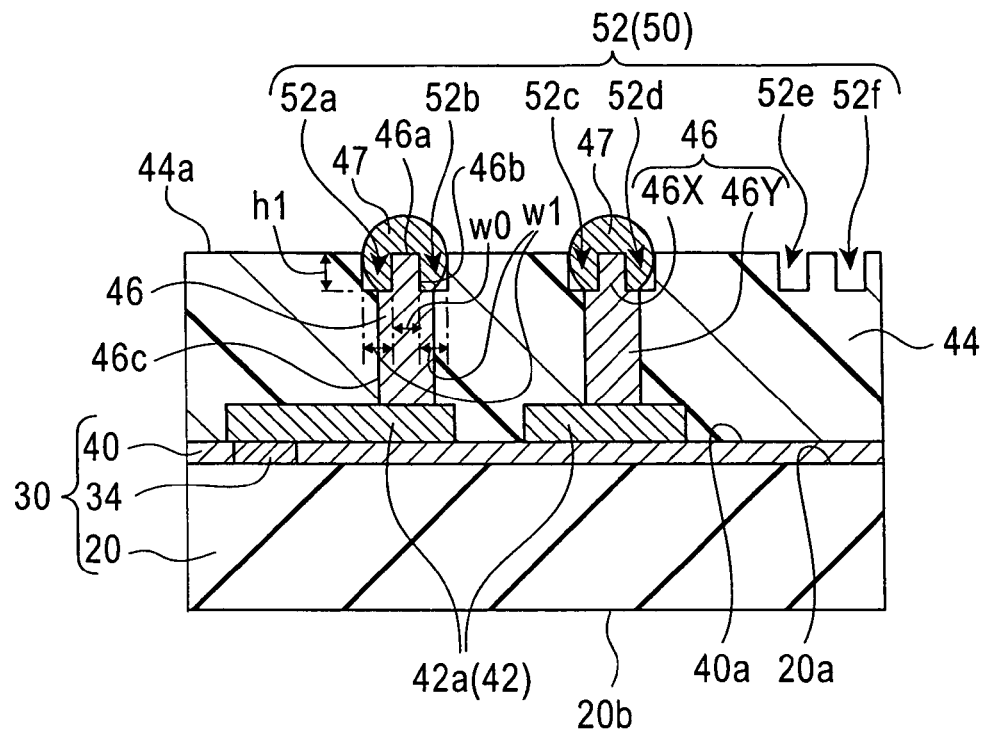
FIG. 2A is a cross-sectional view taken along the dashed line 2A-2A in FIG. 1B.
Figure 2B:
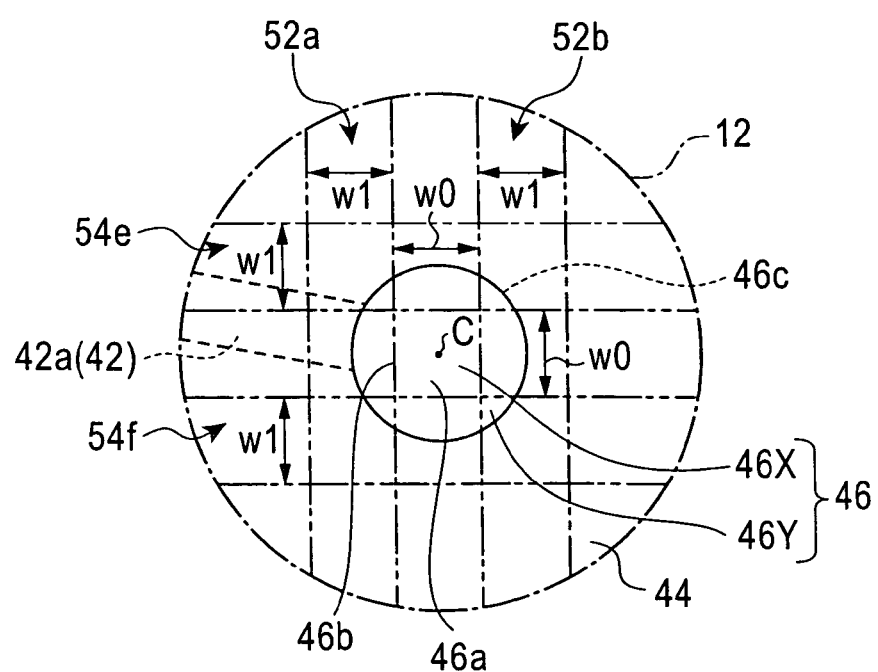
FIG. 2B is an enlarged plan view of the semiconductor device of FIG. 1A, depicting a second partial area indicated by the dotted line in FIG. 1B.

In particular as shown in FIG. 2A, the semiconductor device (W-CSP) 10 includes a semiconductor chip 30 on the silicon (Si) substrate. The semiconductor chip 30 has circuit elements and various functional elements. The circuit element (not illustrated) formed in the thickness of the semiconductor chip 30 includes a plurality of active elements having integrated circuits, such as LSI, so as to implement a predetermined function. In the circuit element, a multilayer interconnect structure (hereafter also called internal interconnect) is normally formed.

The semiconductor chip 30 is square when viewed from the top, and has a plurality of electrode pads 34 on its flat main surface. The electrode pads 34 are connected to associated circuit elements via the internal interconnects. Therefore the electrode pads 34 are also called circuit element connection pads.

The electrode pads 34 are formed along the four edges (four sides) of the semiconductor chip 30, preferably linearly such that the square array of electrode pads 34 is defined. The electrode pads 34 are arranged at equal intervals.

The electrode pads 34 are preferably made of an alloy containing Al (aluminum), an alloy containing Au (gold) or an alloy containing Cu (copper). The material of the electrode pads 34 are not limited to an alloy, but may be any appropriate metal material.

An insulation film 40 is formed such that a part of the surface of these electrode pads 34 is exposed. In the illustrated embodiment, the top faces of the electrode pads 34 are exposed, and the areas between the electrode pads 34 are buried by the insulation film 40. In other words, the insulation film 40 buries the electrode pads 34. The top faces of the electrode pads 34 are coplanar to the top face of the insulation film 40. The insulation film 40 is formed from a known appropriate insulation material, such as silicon nitride (SiN).

On the top face of the insulation film 40, a plurality of interconnects 42a, which are connected to the electrode pads 34 respectively, are formed. These interconnects 42a are also called a wiring pattern (also called rewiring pattern) 42. Each of the interconnects 42a is provided to extend from the associated electrode pad 34 toward inside the square array of the electrode pads 34 in a so-called "fan in structure." In this case, if row lines and column lines, which are in parallel with two sides of the semiconductor chip respectively, are assumed, each interconnect 42a extends so as to pass one of the cross points of these row lines and column lines. It is a matter of design which cross point a certain interconnect 42a passes through.

To each interconnect 42a, each columnar electrode 46 is electrically connected independently. These columnar electrodes 46 stand vertically up from the top face 40a of the insulation film 40. In this embodiment, the columnar electrode 46 has a cylindrical shape, of which the cross section is a circle.

The columnar electrodes 46 are formed such that the pitch of adjacent columnar electrodes 46 becomes the same.

The columnar electrodes 46 are placed on the intersections between the column lines and row lines, along the inside of the array of the electrode pads 34. The column electrodes 46 may be placed on all the intersections of the matrix array, or may be placed on some of the intersections. It is a matter of design which positions (which intersections) the columnar electrodes 46 are provided. This means that one columnar electrode 46 may be formed for one interconnect 42a, or two or more columnar electrodes 46 may be formed for one interconnect 42a.

The interconnects 42a and columnar electrodes 46 are preferably made of copper (Cu) considering easy processing.

A sealing section 44 is formed on the top face 40a of the insulation film 40 where the wiring pattern 42 is formed. The sealing section 44 buries the column-shaped electrodes 46. The top face 44a of the sealing section 44 is formed at the same height (including the case of substantially the same) as the top faces 46a of the electrodes 46 so as to expose the top faces 46a of the electrodes 46 from the sealing section top face 44a.

The sealing section 44 can be formed with sealing resin, such as epoxy mold resin or liquid sealing material.

The shape of the electrodes 46, which are unique elements of semiconductor device 10 of this embodiment, will be described in more detail with reference to FIG. 2A and FIG. 2B.

Each electrode 46 has a protrusion section 46X at the head and a main body section 46Y which downwardly extends from the protrusion section 46X.

The protrusion section 46X is also called the top section, and the cross-sectional area thereof is smaller than the cross-sectional area of the main body section 46Y. In the illustrated embodiment, the cross-sectional shape of the main body section 46Y is a circle, but the cross-sectional shape of the protrusion section 46X is a square or rectangle, and the center of the circle and the center of the square or rectangle are matched. The top face of the protrusion section 46X forms the top face 46a of the electrode 46.

As shown in FIG. 2A, the longitudinal sectional shape of each main body section 46Y is a rectangle, and the longitudinal sectional shape of each protrusion section 46X is a square or rectangle. The protrusion sections 46X are defined by the trench section 50, which is formed from the top face of the sealing section 44 downward or toward the semiconductor chip.

As shown in FIG. 2A and FIG. 2B, the trench section 50 has a lattice shape when viewed from the top. Specifically, a plurality of vertical trench sections 52 and horizontal trench sections 54 cross each other.

The vertical and horizontal sections of the trench section 50 extend in parallel with the sides of the semiconductor chip, and the lateral-sectional shape thereof is a square or rectangle. The protrusion sections 46X are formed in a right angle lattice. In FIG. 2B, one protrusion section is surrounded by four trenches of the trench section 50, that is 52a, 52b, 54e and 54f.

The side face of the protrusion section 46X and the shoulder section of the main body section 46Y cross perpendicular to each other, and form a step difference. The length of the diagonal line of the protrusion section 46X when viewed from the top is shorter than the diameter of the main body section 46Y. In other words, the thickness of the protrusion section 46X is smaller than the thickness of the main body section 46Y.

Now the trench section 50 will be described. FIG. 1B illustrates part of the trench section 50 having the vertical trench section 52 and the horizontal trench section 54. The illustrated vertical trench section 52 includes first, second, third, fourth, fifth and sixth vertical trenches 52a, 52b, 52c, 52d, 52d and 52f, which extend in parallel to each other in the vertical direction (i.e., the white double-headed arrow A direction). The illustrated horizontal trench section 54 includes the first, second, third, fourth, fifth and sixth horizontal trenches 54a, 54b, 54c, 54d, 54e and 54f, which extend in parallel to each other in the horizontal direction perpendicular to the vertical trench sections (i.e., in the white double-headed arrow B direction).

In particular as shown in FIG. 2B, for one electrode 46, the two vertical trenches 52a and 52b and two horizontal trenches 54e and 54f extend such that these trenches do not pass across the center C of the top surface 46a of that electrode 46. The first and second vertical trenches 52a and 52b and the fifth and sixth horizontal trenches 54e and 54f extend in a depth from the sealing section 44 to the top of the main body section 46Y of the electrode 46. The trench section 50 has a width w1, the lateral sectional shape of the protrusion section 46X is a square, and the length of one side of the square is w0. The trench section 50 is formed over the boundary between the sealing section 44 and the electrode 46.

In this case, the width of the horizontal trench section 50, extending in the row direction, is preferably smaller than ½ the distance between the electrodes adjacent to each other in the column direction (pin pitch, that is the distance between centers C). Likewise, the width of the vertical trench section 50, extending in the column direction, is preferably smaller than ½ the distance between the electrodes adjacent to each other in the row direction.

The width w1 of each trench is set to an appropriate value in a range where the object of the present invention is not interfered with.

The shape of the protrusion section 46X, when viewed from top, is not limited to the square, but may be any shape if the shape is confined in the lateral sectional area of the main body section 46Y, and has a top face which is coplanar to the top face of the sealing section 44.

The depth h1 of the trench section 50 can be an appropriate value as long as the object of the present invention is not interfered with, i.e., as long as the depth does not deteriorate the electric characteristics of the semiconductor device, and does not prohibit the enhancement of the bonding strength between the electrode 46 and the solder ball 47.

Now a concrete configuration of the trench section 50 and the protrusion section 46X formed by the trench section 50 will be described more specifically. For example, it is assumed that the pin pitch of W-CSP is 0.8 mm, and the diameter of the electrode 46 is 400 µm.

In this case, it is preferable that the width w1 of the trench section 50 is about 300 µm, and the depth h1 is about 100 µm.

The width w0 of the protrusion section 46X formed by the four trenches 50 (i.e., the first and second vertical trenches 52a and 52b, and first and second horizontal trenches 54a, and 54b) and the top face 46a is about 150 μm. Needless to say, the height of the protrusion section 46X is the same as the depth h1 of the trench section 50. The four side faces of the protrusion section 46X are the exposed faces 46b to the trench section 50.

As shown in FIG. 1B and FIG. 2A, the solder balls 47 are formed on the electrodes 46 respectively, so as to cover the protrusion sections 46X. The solder ball 47 is electrically connected to the columnar electrode 46 via the exposed face which is exposed to the trench section 50, that is the side faces 46b of the protrusion section 46X and the top face 46a of the protrusion section 46X.

The electrode 46 and the solder ball 47 may simply be used as an external terminal.

It should be noted that the pitch of the external terminals may not be the same. Each pitch of the external terminals and the array of external terminals can be arbitrary. In other words, the arrangement of the external terminals is a matter of design, depending on the substrate.

If the external terminals are arranged in a matrix as shown in the drawings, one trench of the trench section 50 can form exposed faces 46b of a plurality of electrodes 46. It should be noted, however, that the trench section 50 may be formed individually for each electrode 46.

According to the configuration of this semiconductor device 10, the top face of the protrusion section 46X of the electrode 46 and the side faces thereof perpendicular to this top face become a bonding face with the solder ball, so that the shape of the bonding face between the protrusion section 46X and the solder ball 47 is complicated three-dimensionally, and the bonding area is increased. Thus, the bonding strength between the electrode 46 and the solder ball 47 can be increased.

According to the configuration of this semiconductor device 10, the area of the top face 46a of the electrode 46 is decreased by being cut when the trenches are created. Particularly, if the electrode 46 is a cylinder of which the diameter (area of the cross-sectional face) does not change, the diameter of the protrusion section 46X becomes smaller than the diameter of the main body section 46Y of the electrode 46 after the cutting.

Therefore, the solder ball 47 can be partially received in the four trenches 50 around the protrusion section 46X, so that a further increase of pins can be implemented without increasing the diameter of the solder balls 47 from a conventional diameter.

In this embodiment, a pair of horizontal trenches 50 are formed for each row of electrodes 46 and a pair of vertical trenches are formed for each column of electrodes 46. This configuration can be applied even when a plurality of types of external terminal pitches are demanded for a single semiconductor device.

The fabrication method for the semiconductor device 10 described with reference to FIGS. 1A, 1B, 2A and 2B will now be described with reference to FIGS. 3A to 3C and FIGS. 4A to 4C.

The semiconductor device 10 fabricated by the fabrication method of this embodiment has a so called W-CSP structure. Therefore, the semiconductor device 10 is acquired by dicing a semiconductor wafer, including a plurality of semiconductor devices formed thereon, into individual chips. The semiconductor devices are formed on the semiconductor wafer in a matrix by a wafer process.

Figure 3A:
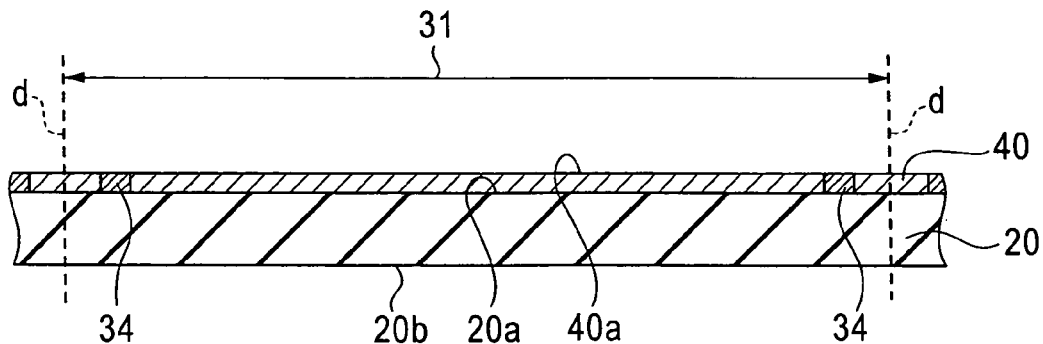
FIG. 3A to 3C are similar to FIG. 2A and show a series of cross-sectional views depicting the fabrication steps of the semiconductor device.
Figure 3B:
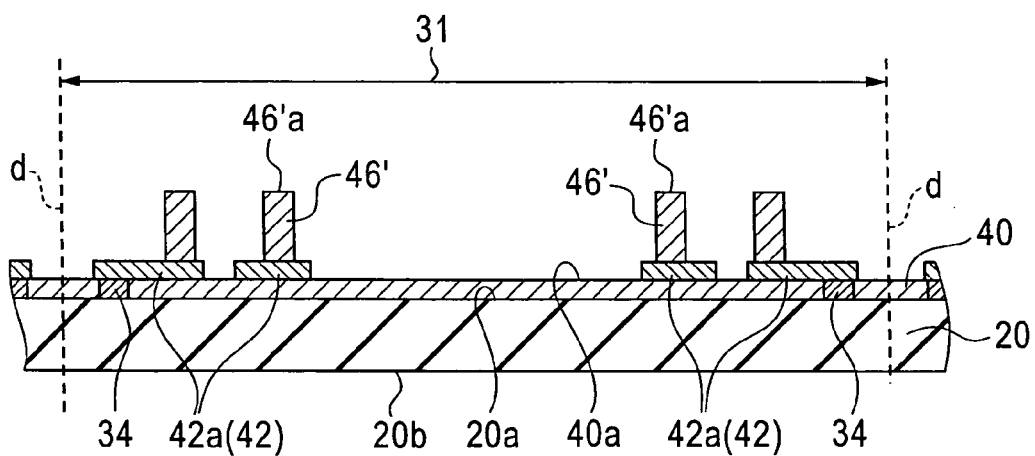
Figure 3C:
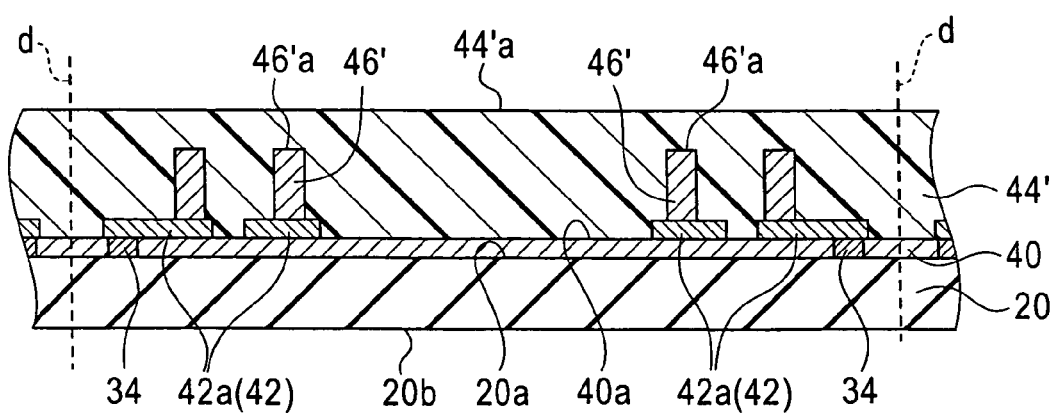

FIGS. 3A, 3B and 3C are cross-sectional views similar to FIG. 2A, and depict a part of the semiconductor wafer, that is one semiconductor device of the final product in the middle of fabrication, as a representative to describe the fabrication method.

Figure 4A:
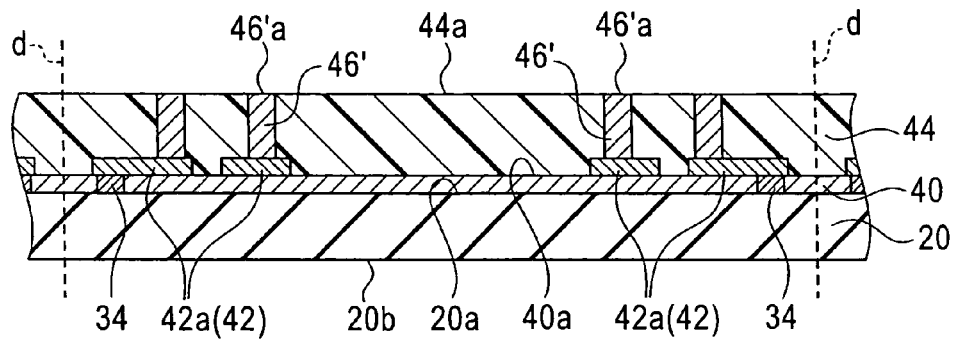
FIG. 4A to 4C are similar to FIG. 2A and show a series of cross-sectional views after FIG. 3C.
Figure 4B:
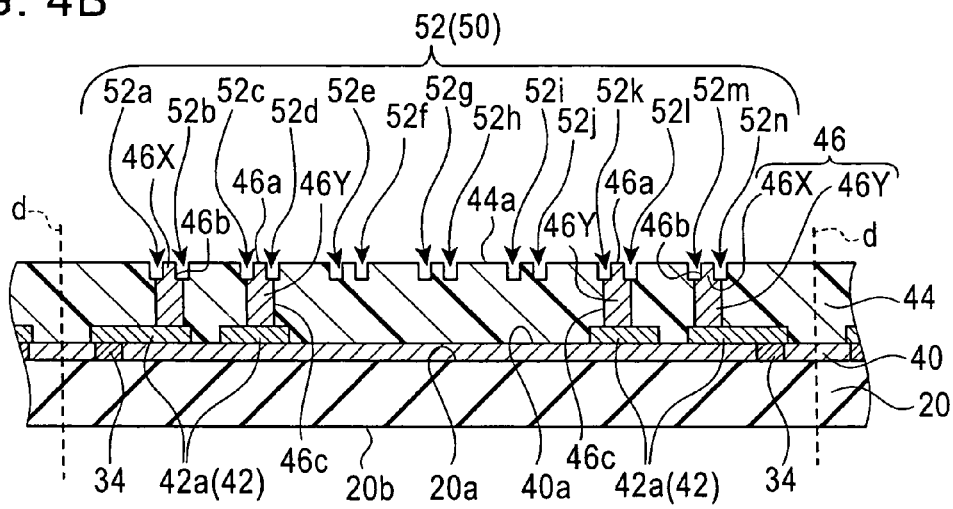
Figure 4C:
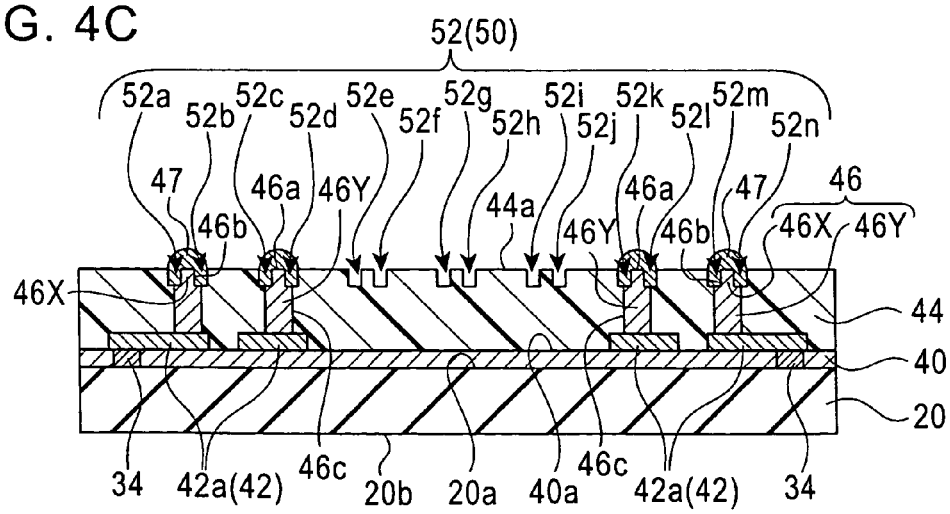

FIGS. 4A, 4B and 4C are diagrams depicting the fabrication steps continued from FIG. 3C.

As illustrated in FIG. 3A, the semiconductor chip formation areas (hereafter may be simply called chip formation area) 31 are formed in a matrix on the semiconductor substrate (semiconductor wafer) 20. It should be noted that only one of the chip formation areas 31 is shown in FIG. 3A.

In each chip formation area 31, circuit elements are formed according to a known appropriate wafer process, and electrode pads 34 are formed on one of the two main surfaces of the semiconductor substrate. After these circuit elements and electrode pads are formed, the semiconductor wafer is diced in accordance with the individual chip formation areas, and semiconductor chips are acquired.

Then an insulation film 40 is formed by a known appropriate step. For example, the insulation film 40 is formed by patterning using a known photolithography technology, with a part of the electrode pads 34, preferably the top faces of the electrode pads 34, being exposed. This insulation film 40 is preferably formed such that the top face 40a becomes flat.

Then, as depicted in FIG. 3B, a wiring pattern (i.e., a rewiring pattern) 42, including a plurality of interconnects 42a which are connected to the exposed electrode pads 34 and extend in the chip formation area 31, is formed on the top face 40a of the insulation film 40 by a known interconnect formation process.

On the rewiring pattern 42, preliminary electrodes 46' are formed vertically up from on the upper main surface of the substrate 20. In this fabrication step for the preliminary electrodes, a conductor such as copper (Cu) is plated using a resist pattern prepared by a known photolithography technology as a mask. The resist is removed subsequently. The preliminary electrodes 46' preferably have a cylindrical shape, but the shape is not restricted to this.

Then, as shown in FIG. 3C, a preliminary sealing section 44', of which the top face 44'a is flat, is formed on the insulation film 40 using a known transfer mold method or a printing method. The preliminary sealing section 44' completely buries the preliminary columnar electrodes 46'.

As shown in FIG. 4A, the preliminary sealing section 44' is cut (ground) and removed from the top face 44'a by a known appropriate method so that the sealing section 44 is formed, and also the top faces 46'a of the preliminary column-shaped electrodes 46' are exposed from the top face 44a of the sealing section 44. In other words, the top face of the sealing section 44 becomes substantially the same height as the top face 46'a of the preliminary electrode 46'.

As shown in FIG. 4B, the preliminary electrodes 46' are processed to columnar electrodes 46 by cutting a part of the exposed top faces 46'a of the preliminary electrodes 46', and forming the trench section 50. The trench section 50 is formed with each trench individually or with a plurality of trenches together by a known dicing device or similar cutting means having a rotating blade (dicing saw). Using this blade, a part of the preliminary electrode 46' is cut off to be the above described cross-sectional form of which width is w1 and height is h1, preferably with a part of the top face 46'a of the preliminary electrode 46' remaining. At the same time, the sealing section 44 is also cut off to a certain extent. Thus, the trench section 50 having the vertical trenches 52 and horizontal trenches 54 is formed. The blade preferably has a shape and width that can form the desired width w1 of the trench section 50.

If two trench sections 50 are formed in between the adjacent electrodes 46 arranged in a row and these trench sections extend in a direction perpendicular to the row of the electrodes 46, the trench width is smaller than ½ the distance (pitch) between the adjacent protrusion sections 46X defined by these trench sections 50. If this trench width is used, one side face of the protrusion section 46X is exposed as one side wall face of the trench 50, and one exposed face of the sealing section 44 is exposed as the other side wall face of the same trench 50 when viewed in the row direction of the electrodes 46.

It should be noted that the trench section may be formed by etching. Specifically, at least the top faces 46'a of the preliminary electrodes 46' are etched using a known appropriate strong acid etchant which can solve a copper or copper alloy, for example.

As described above, the preliminary electrodes 46' become the columnar electrodes 46 each having the protrusion section 46X and the main body section 46Y which is thicker than the protrusion section by forming the trench section 50.

The main body section 46Y is a remaining part of the preliminary electrode 46' under the trench section 50, and the protrusion section 46X is a remaining part of the upper part of the preliminary electrode 46'. The top face of the remaining protrusion section 46X is denoted with the reference symbol 46a. The four side faces, perpendicular to the top face 46a of the protrusion section 46X, face the four trench sections 50, and the thickness of the protrusion section 46X is thinner than the thickness (diameter) of the main body section 46Y.

As illustrated in FIG. 4C, the solder balls 47 are formed on the electrodes 46 according to an ordinary method. Each solder ball 47 is formed so as to cover the protrusion section 46X of the electrode 46 from the top. In other words, each solder ball 47 is formed so as to be bonded to the top face 46a of the electrode 46 and the exposed faces 46b of the electrode 46. The faces 46b are exposed to the trench section 50. The exposed faces 46b define the side faces of the protrusion section 46X. In this way, the solder ball 47 and electrode 46 are electrically connected to each other at the protrusion section 46X.

The smaller the diameter of the solder ball 47 the better. For example, the diameter of the solder ball 47 may be formed to be smaller than the diameter of the main body section 46Y of the electrode 46 in some cases. In this case, the pitch of the external terminals can be decreased.

At this point, the packaging of semiconductor devices on the wafer level completes.

Then the semiconductor wafer 20 is diced into individual chips along the dicing lines d using a known dicing device.

In this way, a plurality of semiconductor devices 10 having an identical structure can be fabricated from one wafer.

According to this fabrication method, the semiconductor device 10 having the above described configuration can be fabricated efficiently.

Second Embodiment

Now the second embodiment of the present invention will be described with reference to FIGS. 5A, 5B, 5C, 6A and 6B.

The same composing elements as the first embodiment are denoted with the same reference symbols, and detailed description thereof will be omitted. However, among such composing elements, those required for understanding the configuration of the semiconductor device of the second embodiment will be described in brief.

A configuration of the semiconductor device of the present embodiment will be described first with reference to FIGS. 5A, 5B and 5C. The plan view of the semiconductor device 10 of this embodiment is omitted since it is exactly the same as FIG. 1A.

Figure 5A:
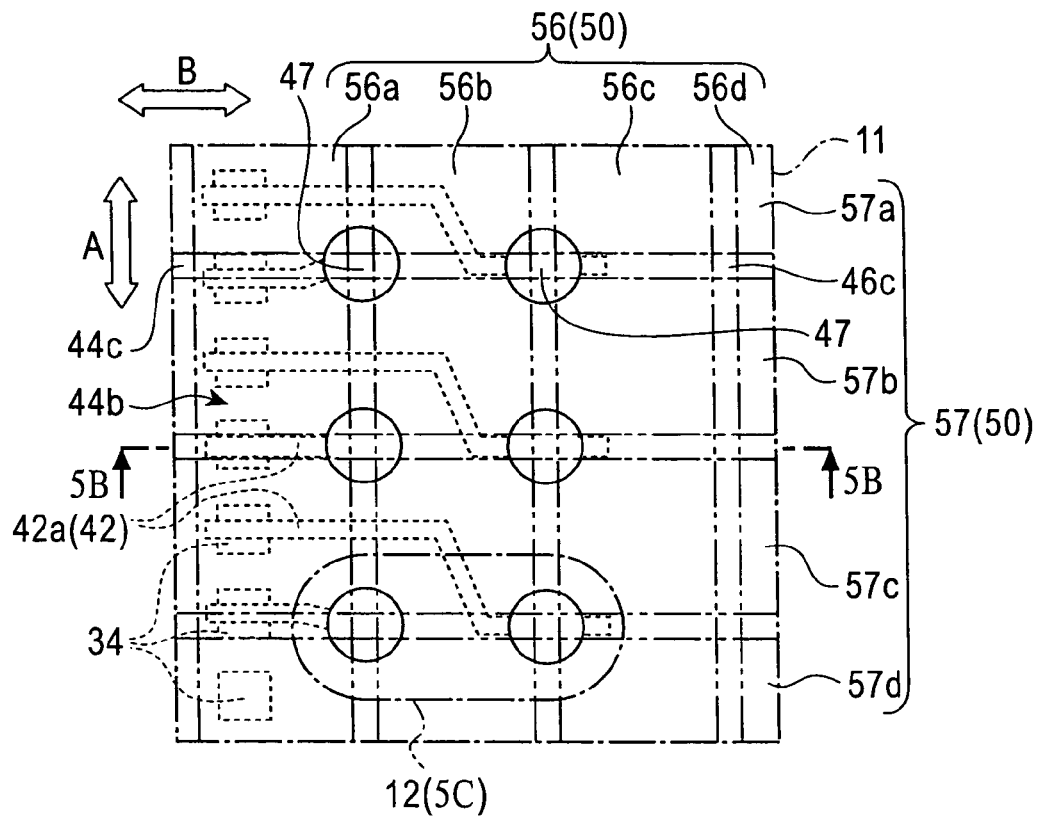
FIG. 5A is a plan view depicting major parts of the semiconductor device according to a second embodiment of the present invention.

FIG. 5A is similar to FIG. 1B. FIG. 5A is an enlarged plan view of major portions of the semiconductor device 10, depicting the area corresponding to the first area 11 enclosed by the solid line 11 in FIG. 1A. FIG. 5B is a cross-sectional view taken along the dashed line 5B-5B in FIG. 5A. FIG. 5C is an enlarged plan view depicting the second area 12 enclosed by the dotted line in FIG. 5A. The solder balls 47, which actually exist, are omitted to describe the structure below the solder balls.

The semiconductor device (W-CSP) 10 includes a semiconductor chip 30. This semiconductor chip 30 has a plurality of electrode pads 34.

An insulation film 40 is formed such that a part of the surface of these electrode pads 34, i.e., the top faces of the electrode pads 34 in this embodiment, is exposed. On the top face of the insulation film 40, a wiring pattern (rewiring pattern) 42, including a plurality of interconnects 42a, which are connected to the electrode pads 34, is formed.

To each interconnect 42a, an electrode 46, which has a cylindrical shape in this embodiment, is electrically connected. Like the first embodiment, each of the electrodes 46 has a main body section 46Y at the interconnect 42a side and a protrusion section 46X at the head where the solder ball 47 is formed. The protrusion section 46X is thinner than the main body section 46Y. In other words, the cross-sectional area of the main body section 46Y is larger than the cross-sectional area of the protrusion section 46X.

A sealing section 44 is formed on the top face 40a of the insulation film 40 where the wiring pattern 42 is formed, such that the electrodes 46 are buried. The heights of the surface 40a and top face 46a are substantially the same.

The difference of the configuration of the second embodiment from the configuration of the first embodiment is the shape of the trench section 50, which determines the shape of the protrusion section 46X of the electrode 46. This point will now be described.

In the second embodiment, the protrusion sections 46X of all the electrodes 46 protrude from the flat top face 44b of the sealing section 44, which buries the main body sections 46Y. Therefore, the trench section 50 is a concave section having a depth which allows the top face of the shoulder section of the main body section 46Y to be exposed from the flat face 44b of the sealing section 44. The depth of the trench section 50 is a depth from the top surface 44a of the sealing section 44 (i.e., the top face 46a of the protrusion section 46X) to the flat surface 44b of the sealing section 44.

This concave section is formed in the entire top face of the sealing section 44. It should be noted that some portions of the sealing section 44 may remain like islands 44c on the top surface of the sealing section, depending upon a method employed to create the concave section. However, the area ratio of these isolated portions 44c to the concave section is small. Thus, the term "entire area" includes the case of "substantially the entire area".

The bottom face of the concave section is the flat top face 44b of the sealing section 44.

It can be said that the trench section 50, that is the concave section, is formed by wide row direction (horizontal) trenches and wide column direction (vertical) trenches. This will be described below.

The trench section 50 has the wide vertical trench sections 56 and the wide horizontal trench sections 57. Among those, FIG. 5A shows the first, second and third vertical trench sections 56a, 56b and 56c which extend in parallel with each other in the white double-headed arrow A direction, and also shows the first, second, third and fourth wide horizontal trench sections 57*a*, 57*b*, 57*c* and 57*d* which extend in parallel with each other in the white double-headed arrow B direction.

Figure 5B:
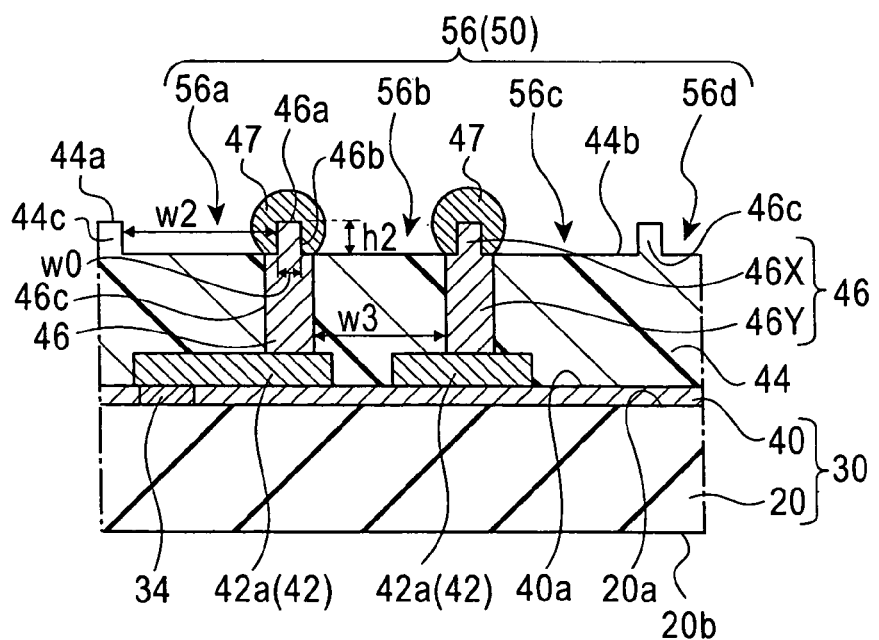
FIG. 5B is a cross-sectional view taken along the line 5B-5B in FIG. 5A.

As shown in FIG. 5A and FIG. 5B, the trench section 50 is formed such that a plurality of vertical trenches and a plurality of horizontal trenches are crossed in a lattice.

For one electrode 46, two trenches 50 extending in the vertical direction and two trenches 50 extending in the horizontal direction are formed such that these trenches do pass through the center C of the top face 46*a* of the protrusion section 46X of the electrode 46, and this configuration is the same as the first embodiment. The difference from the first embodiment is that an individual vertical trench has a width equivalent to the distance (w2) between the side faces of the horizontally adjacent protrusion sections 46X, and an individual horizontal trench has a width equivalent to the distance between the side faces of the vertically adjacent protrusion sections 46X.

Figure 5C:
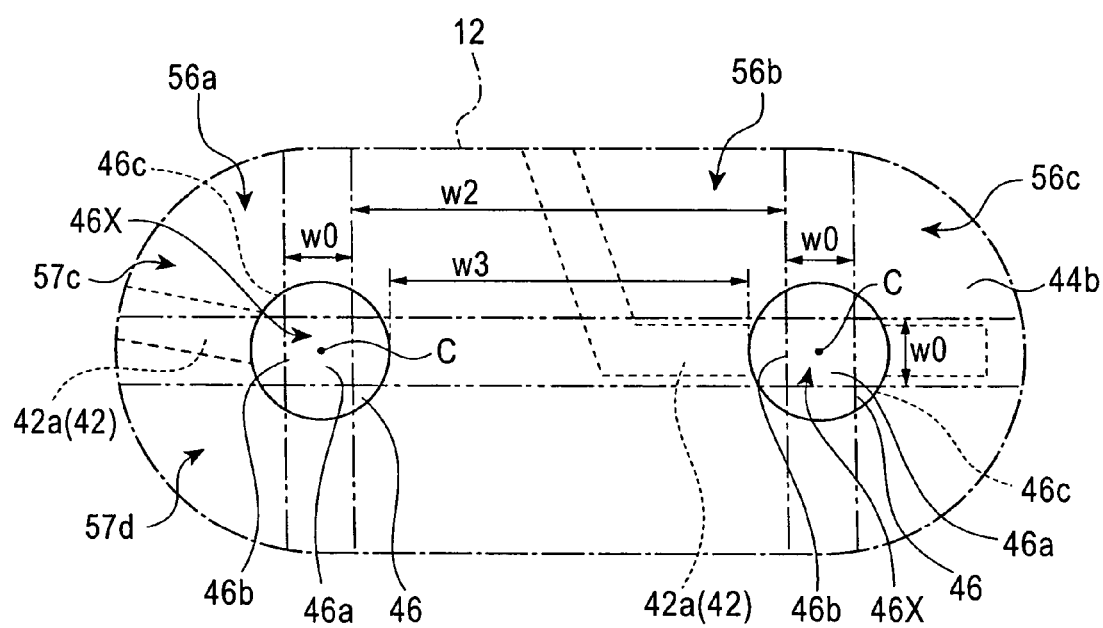
FIG. 5C is an enlarged plan view of a particular area specified in FIG. 5A.

As illustrated in FIG. 5C, the wide vertical trench section 56 and the wide horizontal trench section 57 have a trench width w2 which is greater than the width w3 between the main body sections 46Y of the adjacent electrodes 46.

The shape and dimensions of the protrusion sections 46X in the second embodiment may be the same shape and dimensions as those in the first embodiment.

The depth h2 of the trench section 50 in the second embodiment can have an arbitrary appropriate value as long as the object of the present invention is not interfered with, i.e., as long as the bonding strength between the electrode 46 and the solder ball 47 can be improved without interfering with electric characteristics.

It is preferable that the width w2 of the trench section 50 is about 650 μm, and the depth h2 is about 100 μm.

The width w0 of the protrusion section 46X formed by the top face 46*a* and the four trenches 50, namely, the first and second vertical trench sections 56*a* and 56*b*, and the first and second horizontal trench sections 57*a* and 57*b*, is about 150 μm. The height of the protrusion section 46X is the same as the depth h2 of the trench section 50.

The solder balls 47 are formed so as to cover the protrusion sections 46X, just like the case of the first embodiment. Each solder ball 47 is electrically connected to the associated electrode 46 via the top face 46*a* of the protrusion section 46X and the side surfaces of the protrusion sections 46X exposed to the trench section 50 (i.e., the side faces 46*b* of the protrusion section 46X).

According to the configuration of the semiconductor device 10 of the second embodiment, the shape of the bonding face between the protrusion section 46X and the solder ball 47 can be complicated three-dimensionally, and the bonding area can be increased. Thus, the bonding strength of the columnar electrode 46 and the solder ball 47 can be increased.

Like the first embodiment, the diameter of the solder ball 47 does not increase, so that a further increase of pins can be realized.

The fabrication method for the semiconductor device 10 described with reference to FIGS. 5A to 5C will now be described with reference to FIGS. 6A and 6B.

The fabrication steps up to the step of exposing the top faces 46'*a* of the preliminary electrodes 46' from the sealing section 44, described above with reference to FIG. 4A, are exactly the same as the steps described in the first embodiment, so that description thereof is omitted here.

Figure 6A:
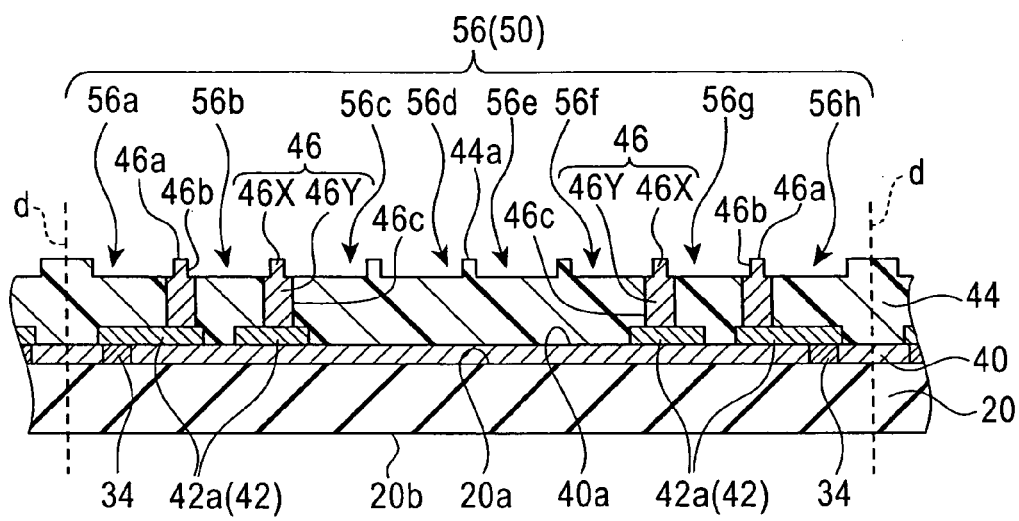
FIGS. 6A and 6B are cross-sectional views depicting the fabrication method according to the second embodiment of the present invention.
Figure 6B:
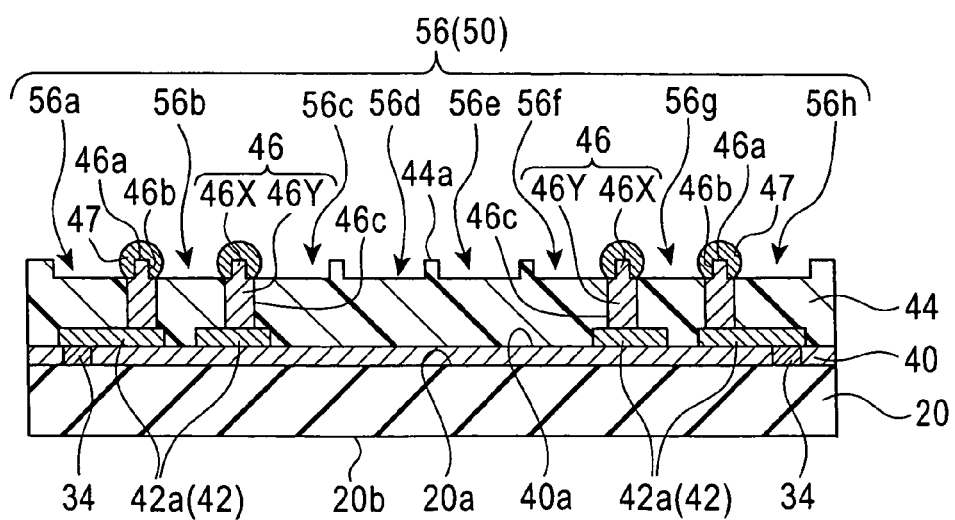

FIG. 6A and FIG. 6B are cross-sectional views of a part of the structure, that is one semiconductor device of the final product, in the middle of fabrication, as a representative to describe the fabrication steps.

As shown in FIG. 6A, a part of the exposed top faces 46*a* of the preliminary electrodes 46' are cut off so that the trench section 50, that includes the wide vertical trench sections 56 and the wide horizontal trench sections 57, is formed. The trench section 50 is formed with each trench individually or with a plurality of trenches together by a known dicing device or similar cutting means having a rotating blade (dicing saw).

Using this blade, the trench section 50 of which cross-section has width w2 and depth h2 is formed. Preferably, the blade has a shape and blade width with which the width w2 of the trench section 50 can be formed.

The electrodes 46 are arranged in the matrix fashion so that it can be said that the electrodes 46 are arranged in the row and the column directions. The vertical trench sections 56 extend perpendicularly to the row of the electrodes 46, and the horizontal trench sections 56 extend perpendicularly to the column of the electrodes 46. Each vertical trench section 56 extends vertically between each two adjacent electrodes 46, and each horizontal trench section 56 extends horizontally between each two adjacent electrodes. It is preferable that this trench section 50 is formed with a trench width which is the distance between two adjacent protrusion sections 46X formed by this trench section 50. If such a trench width is used, the side faces of the adjacent protrusion sections 46X are exposed respectively facing each other.

By forming this trench section 50, the preliminary electrodes 46' become the column-shaped electrodes 46 each of which has the main body section 46Y and the protrusion section 46X, just like the case of the first embodiment.

Then, as shown in FIG. 6B, the solder balls 47 are formed on the electrodes 46 according to an ordinary method. Each solder ball 47 is formed so as to cover the protrusion section 46X of the electrode 46 from the top, just like the case of the first embodiment. In other words, each solder ball 47 is formed so as to be bonded to the top face 46*a* of the electrode 46 and the exposed faces 46*b* of the electrode 46 which are exposed to the trench section 50. As a result, the solder ball 47 is electrically connected so as to cover the partial area of the electrode 46.

At this time, just like the case of the first embodiment, the smaller the diameter of the solder ball 47 the better. In some cases, the diameter of the solder ball 47 may be formed to be smaller than the diameter of the main body section 46Y. If so, the pitch of the external terminals can be further decreased.

At this point, the packaging of the semiconductor devices on the wafer level completes.

Then the semiconductor wafer 20 is diced into individual chips along the dicing line d using a known dicing device. In this way, a plurality of semiconductor devices 10 having an identical structure can be fabricated from one wafer.

According to the fabrication method for the semiconductor device 10, a blade having a wide width spanning two electrodes 46 is used. Consequently, the formation of the trench section 50, in particular, can be carried out efficiently.

It should be noted that the electrodes 46 are provided in the matrix fashion, but it means that the electrodes 46 may be provided at every intersection of the matrix or may be provided at some of the intersections.

Third Embodiment

The third embodiment of the present invention will now be described with reference to FIGS. 7A, 7B, 7C, 8A and 8B.

The same composing elements as the first embodiment are denoted with the same reference symbols, and detailed description thereof will be omitted. However, among such composing elements, those required for understanding the configuration of the third embodiment will be described briefly.

The semiconductor device of the third embodiment will now be described with reference to FIGS. 7A to 7C. The plan view of the semiconductor device 10 of this embodiment is exactly the same as FIG. 1A, so that an illustration is omitted.

Figure 7A:
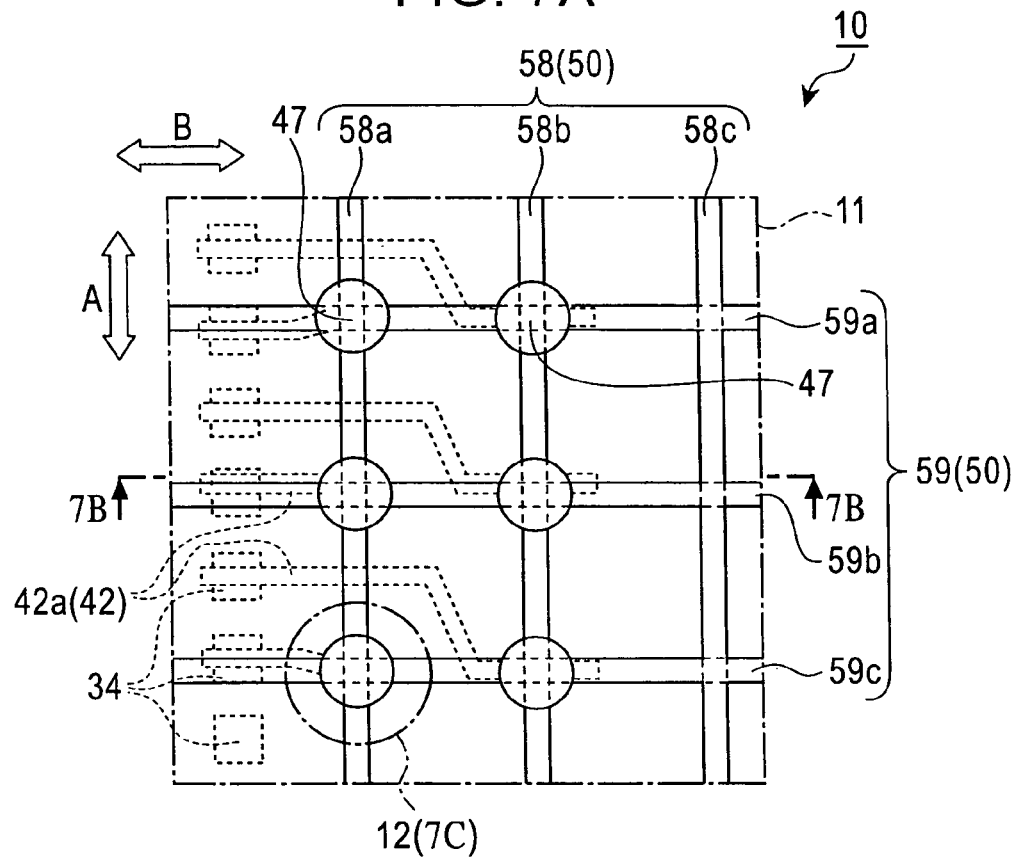
FIG. 7A is a plan view depicting major parts of the semiconductor device according to the third embodiment of the present invention.

FIG. 7A is similar to FIG. 1B. Specifically, FIG. 7A is an enlarged plan view of major portions of the semiconductor device 10 depicting an area corresponding to the first partial area 11 enclosed by the solid line in FIG. 1A. FIG. 7B is a cross-sectional view taken along the dashed line 7B-7B in FIG. 7A. FIG. 7C is an enlarged plan view depicting the second partial area 12 indicated by the dotted line in FIG. 7A. The solder balls 47, which actually exist, are omitted to describe the structure below the solder balls 47.

The semiconductor device (W-CSP) 10 includes a semiconductor chip 30, which has various elements integrated on the silicon substrate 20. The semiconductor chip 30 has a plurality of electrode pads 34.

An insulation film 40 is formed such that a part of the surface of the electrode pads 34 (i.e., top faces of the electrode pads 34 in this embodiment) is exposed. On the top face 40a of the insulation film 40, a wiring pattern (rewiring pattern) 42 including a plurality of interconnects 42a, which are connected to the electrode pads 34, is formed.

Cylindrical electrodes 46 are electrically connected to the interconnects 42a.

A sealing section 44 is formed on the surface 40a of the insulation film 40 such that the electrodes 46 are buried by the sealing section 44. The height of the surface 44a and the height of the top face 46a are substantially the same.

A major difference of this semiconductor device 10 from the first and second embodiments is the structure of the electrodes 46, which are formed entirely or partially on the surface in a matrix. In other words, in the third embodiment, the head section of the electrode 46 has a trench or a hole, which has a predetermined depth from the top face 46a. The shape of the trench or hole formed in the head of the electrode 46 can be an appropriate shape according to the design. This point will now be described.

The vertical trench section 58 and the horizontal trench section 59 of the trench section 50 have a rectangular sectional shape in the direction perpendicular to the extending direction (width w4 direction). The lateral sectional shape of the trench section 50, however, is not limited to this, but may be an arbitrary appropriate shape, such as a shape including a curve.

Each electrode 46 includes a protrusion section 46P, for electronic connection with the solder ball 47, and a main body section 46Q downwardly extending from the protrusion section.

The protrusion section 46P includes four parts in this embodiment. The four protrusion sections 46P have identical dimensions and shapes. These protrusion sections 46P are formed by a single vertical trench section and a single horizontal trench section which are crossing each other, so that the side faces 46R of each two protrusion sections 46P, which face each other, are parallel to each other and are perpendicular to the bottom face 46S of the trench section 50. The bottom face 46S is formed in a cross shape, forming the top face of the main body section 46Q existing below.

Figure 7B:
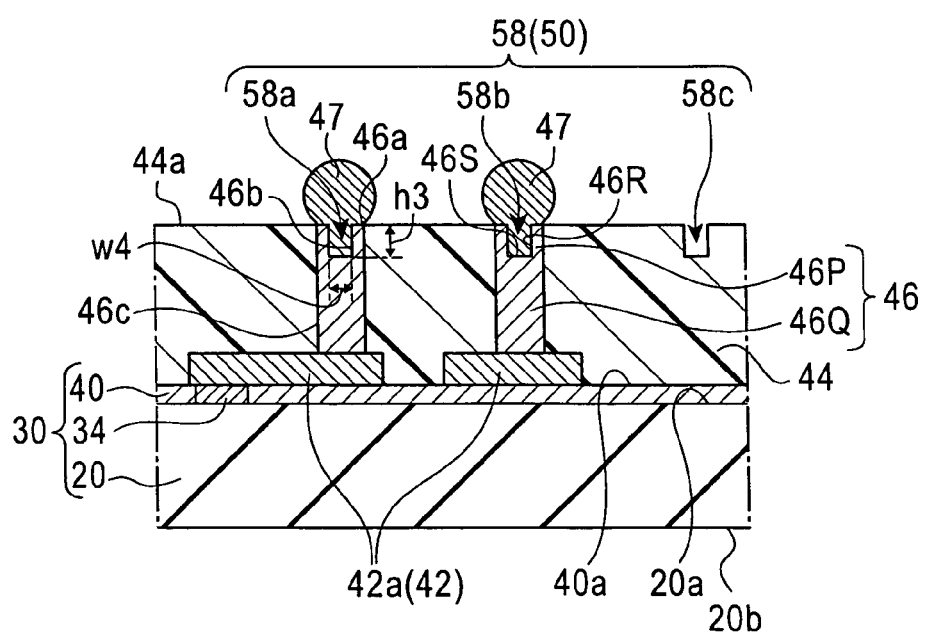
FIG. 7B is a cross-sectional view taken along the line 7B-7B in FIG. 7A.
Figure 7C:
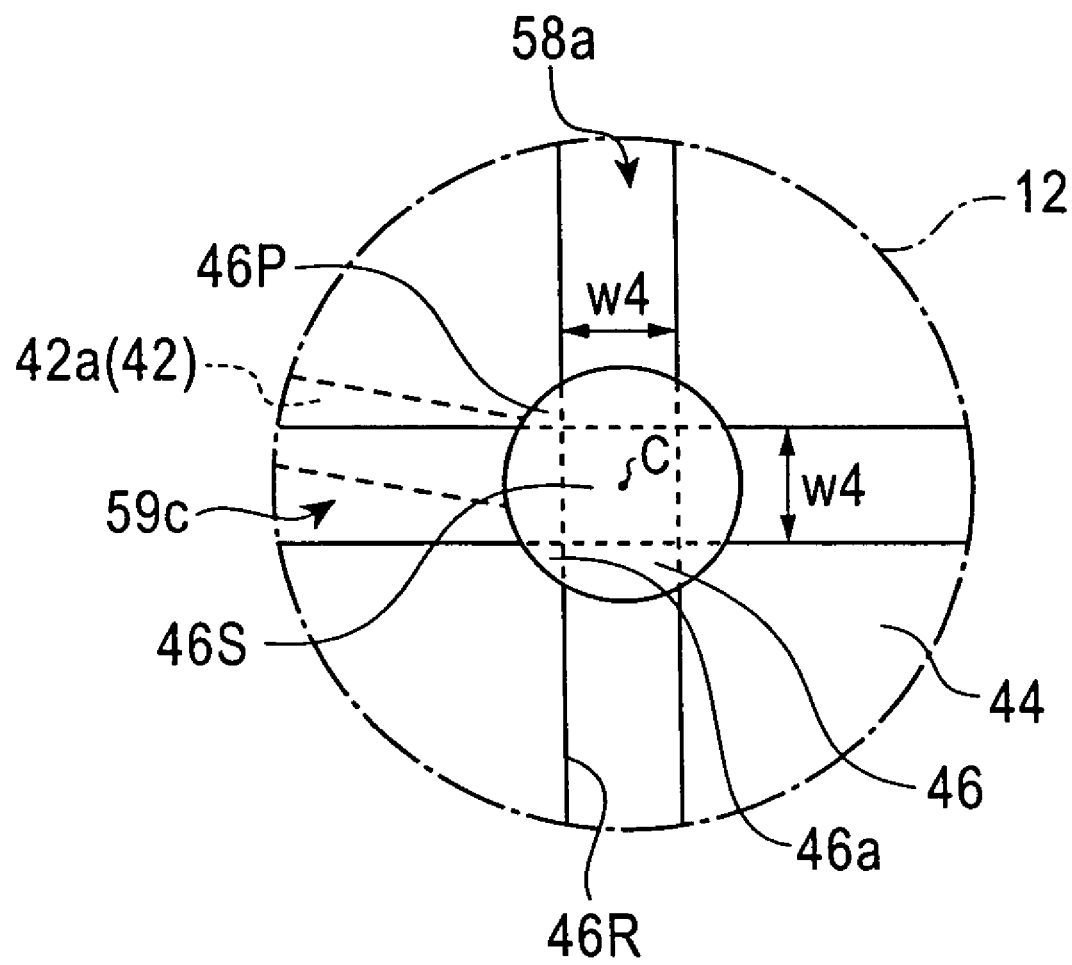
FIG. 7C is an enlarged plan view of a particular area specified by the chain line in FIG. 7A.

In this embodiment, as shown in FIGS. 7A, 7B and 7C, the vertical and horizontal trench sections 50 are formed in the top surface of the sealing section 44 in a lattice shape. Also, each horizontal trench section 50 extends through the heads of a plurality of electrodes 46 arranged in the row direction, and each vertical trench section extends through the heads of a plurality of electrodes 46 arranged in the column direction. FIG. 7A shows the first, second and third vertical trench sections 58a, 58b and 58C which extend in parallel with each other in the vertical or column direction (i.e., in the white double-headed arrow A direction), and shows the first, second and third horizontal trench sections 59a, 59b and 59c which extend in parallel with each other in the horizontal or row direction (i.e., in the white double-headed arrow B direction).

As shown in FIG. 7C, the vertical trench section 58a and the horizontal trench section 59c separate the top face 46a into four areas having the same shape (i.e., four protrusion sections 46P). The reference symbol C indicates the center of the top face 46'a of the preliminary electrode 46'.

In this embodiment, the vertical trench section 58 and the horizontal trench section 59 extend through the center point C of the circular top face 46' of the preliminary electrode 46' or through the diameter of the circular top face 46'a of the preliminary electrode 46. In other words, the vertical trench section 58 and the horizontal trench section 59 cross each other at the center C of the top face 46'a, and form the cross shaped trenches on the top face 46'a, separating the top face 46a into four equal areas. The four protrusion sections 46P of each electrode 46 are formed by the two crisscrossing trench sections 50, and have the side faces, that are exposed to these trench sections 50.

The top face 46a of each electrode 46 is divided into the four areas by the two trench sections 50 in the illustrated embodiment, but the present invention is not limited to this configuration. For example, two protrusion sections may be formed by separating the top face 46'a into two areas by one vertical (or horizontal) trench section 50, or four or more protrusion sections may be formed by separating the top face into four or more areas by three or more trench sections 50. The trench section 50 may be formed without including the center point C of the circular top face 46'a of the preliminary electrode 46'.

The trench width w4 of the vertical trench section 58 and the horizontal trench section 59 is preferably about ⅓ the diameter of the electrode 46 at the maximum, considering the resistance to stress.

The vertical trench sections 58 and the horizontal trench section 59 have the same trench width (w4) in the illustrated embodiment, but they may have different trench widths independently. In general, the same trench width is preferable considering the easiness of fabrication.

In the third embodiment, the two trench sections 50 crisscross the head section 46a of the electrode 46, and the four protrusion sections 46P are formed. Alternatively, these trench sections 50 may be replaced by a hole or recess which does not extend outside the head section 46a, and the electrode 46 may have a single protrusion section 46P. The shape of this hole may be an arbitrary appropriate shape according to the design. In this case, the protrusion section 46P has the same diameter as the main body section 46Q. The hole or recess formed in the protrusion section 46P receives part of a solder ball 47. It should be noted that this hole can be defined by very short crisscrossing trenches which do not extend beyond the top face 46a of the electrode 46.

The depth h3 of the trench section 50 can be an arbitrary appropriate depth as long as the object of the present invention is not interfered with, i.e., as long as the bonding strength between the electrode 46 and the solder ball 47 can be improved without deteriorating electric characteristics of the semiconductor device 10.

The solder ball 47 is formed such that the vertical groove 58 and the horizontal groove 59 in the electrode head are filled with the solder ball 47, and the top face 46a of the protrusion section 46P of the column-shaped electrode 46 is covered with the solder ball 47. Therefore, the solder ball 47 is electrically connected to the exposed faces 46b, which are exposed to the trench section of the protrusion section 46P, and the top face 46a.

According to the semiconductor device 10 of the third embodiment, the shape of the bonding face between the electrode 46 and the solder ball 47 can be complicated three-dimensionally and the bonding area can be increased, just like the first and second embodiments, so that the bonding strength of the electrode 46 and the solder ball 47 can be increased.

The diameter of the solder ball 47 is not increased. Thus, a further increase of pins can be implemented.

The fabrication method for the semiconductor device 10 described with reference to FIGS. 7A to 7C will now be described with reference to FIGS. 8A and 8B.

The manufacturing processes up to exposing the top face 46'a of the preliminary electrode 46' from the sealing section 44, described with reference to FIG. 4A, are exactly the same as those described in the first embodiment, so that description thereof is omitted.

Figure 8A:
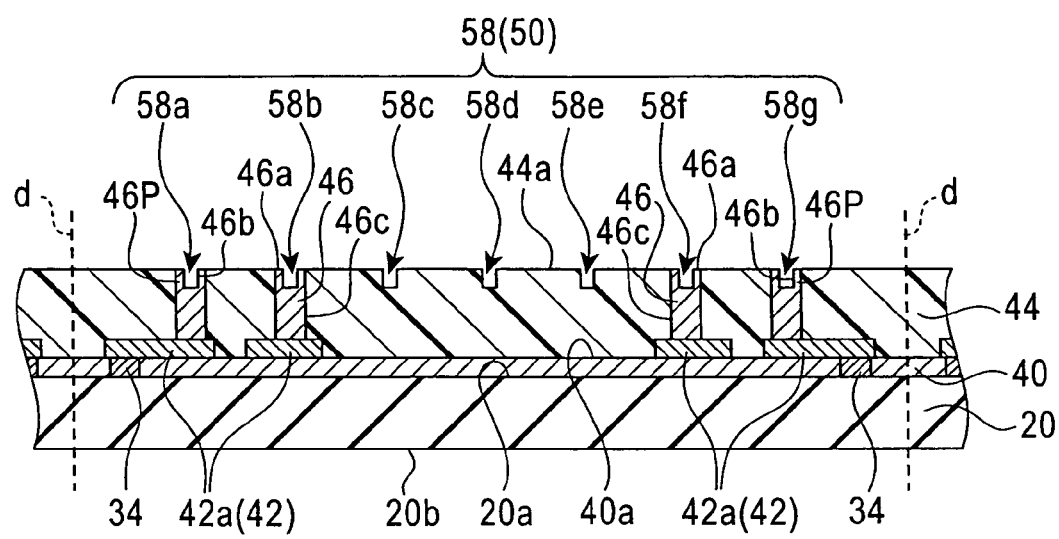
FIGS. 8A and 8B are cross-sectional views depicting a fabrication method for the semiconductor device of the third embodiment.
Figure 8B:
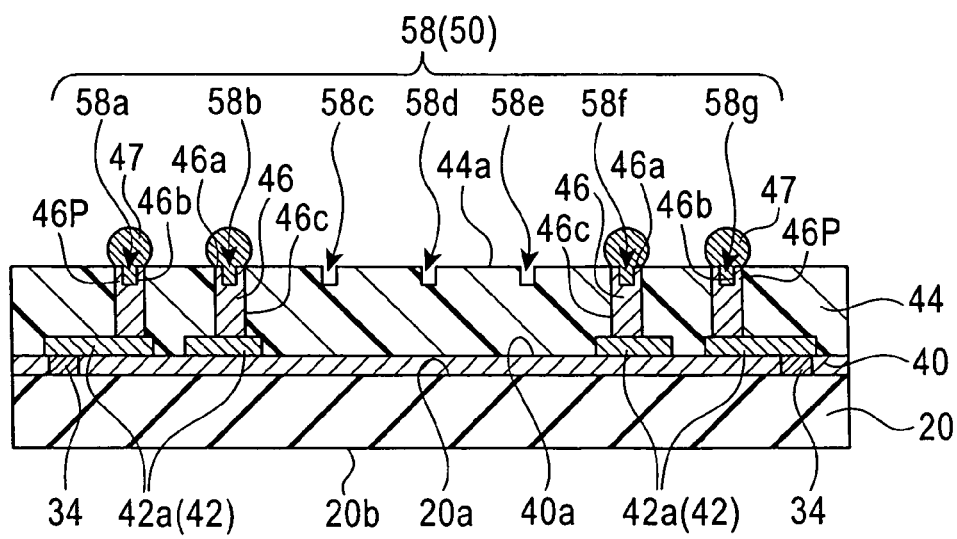

FIGS. 8A and 8B are cross-sectional views of a part of the structure that is one final semiconductor device of the final product in the middle of fabrication as a representative to describe the fabrication method.

As shown in FIG. 4A, a part of the top face 46'a of each preliminary electrodes 46' is removed, and the trench section 50 that includes the vertical groove 58 and the horizontal groove 59 is formed in each preliminary electrode, as shown in FIG. 8A. Each trench section 50 may be formed individually or a plurality of trench sections 50 may be formed together, by a known dicing device or a similar cutting means having a rotating blade (dicing saw).

Using this blade, the trench section 50 is formed so as to have the cross-sectional form of which width is w4 and depth is h3. It is preferable that the blade has a blade width that can form the width w4 of the trench section 50.

Then as shown in FIG. 8B, the solder balls 47 are formed on the respective electrodes 46 according to an ordinary method. Each solder ball 47 is formed so as to cover the protrusion section 46P of the associated electrode 46. In other words, the vertical trench section 58 and the horizontal trench section 59 are filled with the solder ball 47, and the top face 46a of the electrode 46 is covered by the solder ball 47. The solder ball 47 is therefore electrically connected to the protrusion section 46P.

The smaller the diameter of the solder ball 47, the better. For example, the diameter of the solder ball 47 is smaller than the diameter of the electrode 46. The pitch of the external terminals can be decreased by the solder balls having a smaller diameter.

At this point, the packaging of the semiconductor devices on the wafer level completes.

Then the semiconductor wafer 30 is diced into individual chips along the dicing line d using a known dicing device. In this way, a plurality of semiconductor devices 10, having an identical structure, can be fabricated from one wafer.

According to this fabrication method for the semiconductor device 10, the trench section 50 can be formed matching the array of the electrodes 46, so that the fabrication can be carried out more efficiently.

This application is based on Japanese Patent Application No. 2005-300576 filed on Oct. 14, 2005 and the entire disclosure thereof is incorporated herein by reference.

What is claimed is:

1. A semiconductor device comprising:
a semiconductor chip having two main surfaces;
a plurality of electrode pads on one of the two main surfaces of the semiconductor chip, each of said electrode pads having a top face;
an insulation film on said one main surface of the semiconductor chip such that the top face of each of said electrode pads is exposed;
a rewiring pattern having a plurality of interconnects connected to said electrode pads respectively, and which extend over said insulation film;
a plurality of column-shaped electrodes connected to said plurality of interconnects, respectively and standing in a direction perpendicular to said one main surface, each of said column-shaped electrodes having a main body section connected to one of the interconnects and a protrusion section extending from said main body section, each said protrusion section having a top face, said main body section having a substantially flat top face, said protrusion section extending perpendicularly upwards from the flat top face of said main body section, and said protrusion section having a cross-sectional diameter in a direction parallel to said one main surface that is smaller than a cross-sectional diameter of said main body section in the direction parallel to said one main surface;
a sealing section on said rewiring pattern and said insulation film, said sealing section buries said column-shaped electrodes and has a top face having a same height as the top faces of said protrusion sections of said column-shaped electrodes;
a plurality of trench sections in said sealing section, each of said trench sections having a depth from the top face of said sealing section to a boundary between said protrusion section and said main body section such that side faces of each said protrusion sections are exposed by said trench sections; and
a plurality of solder balls, said solder balls being respectively over said protrusion sections such that said solder balls are respectively electrically connected with said column-shaped electrodes by being bonded to the top face and said side faces of said protrusion sections,
wherein a cross-sectional shape of said protrusion section and a cross-sectional shape of said main body section in the direction parallel to said one main surface are respectively square and circular.

2. A semiconductor device comprising:
a semiconductor chip having two main surfaces;
a plurality of electrode pads on one of the two main surfaces of the semiconductor chip, each of said electrode pads having a top face;
an insulation film on said one main surface of the semiconductor chip such that the top face of each of said electrode pads is exposed;
a rewiring pattern having a plurality of interconnects connected to said electrode pads respectively, and which extend over said insulation film;
a plurality of column-shaped electrodes connected to said plurality of interconnects, respectively and standing in a direction perpendicular to said one main surface, each of said column-shaped electrodes having a main body section connected to one of the interconnects and a protrusion section extending from said main body section, each said protrusion section having a top face, said main body section having a substantially flat top face, said protrusion section extending perpendicularly upwards from the flat top face of said main body section, and said protrusion section having a cross-sectional diameter in a direction parallel to said one main surface that is smaller than a cross-sectional diameter of said main body section in the direction parallel to said one main surface;

a sealing section on said rewiring pattern and said insulation film, said sealing section buries said column-shaped electrodes and has a top face having a same height as the top faces of said protrusion sections of said column-shaped electrodes;

a plurality of trench sections in said sealing section, each of said trench sections having a depth from the top face of said sealing section to a boundary between said protrusion section and said main body section such that side faces of each said protrusion sections are exposed by said trench sections; and a plurality of solder balls, said solder balls being respectively over said protrusion sections such that said solder balls are respectively electrically connected with said column-shaped electrodes by being bonded to the to face and said side faces of said protrusion sections, wherein a cross-sectional shape of said protrusion section and a cross-sectional shape of said main body section in the direction parallel to said one main surface are respectively rectangular and circular.

3. A semiconductor device comprising:

a semiconductor chip having two main surfaces;

a plurality of electrode pads on one of the two main surfaces of the semiconductor chip, each of said electrode pads having a top face;

an insulation film on said one main surface of the semiconductor chip such that the top face of each of said electrode pads is exposed;

a rewiring pattern having a plurality of interconnects connected to said electrode pads respectively, and which extend over said insulation film;

a plurality of column-shaped electrodes connected to said plurality of interconnects, respectively and extending in a direction perpendicular to said one main surface, each of said column-shaped electrodes having a main body section connected to one of the interconnects and a protrusion section extending from said main body section, each said protrusion section having a top face, said protrusion section having a cross-sectional diameter in a direction parallel to said one main surface that is smaller than a cross-sectional diameter of said main body section in the direction parallel to said one main surface;

a sealing section which is on said rewiring pattern and said insulation film, said sealing section buries said column-shaped electrodes and has a top face having a same height as the top faces of said protrusion sections of said column-shaped electrodes;

a plurality of trench sections in said sealing section, each of said trench sections having a depth from the top face of said sealing section to a boundary between said protrusion section and said main body section such that side faces of each said protrusion sections are exposed by said trench sections; and a plurality of solder balls, said solder balls being respectively over said protrusion sections such that said solder balls are respectively electrically connected with said column-shaped electrodes by being bonded to the top face and said side faces of said protrusion sections, wherein a cross-sectional shape of said protrusion section and a cross-sectional shape of said main body section in the direction parallel to said one main surface are respectively square and circular.

4. A semiconductor device comprising:

a semiconductor chip having two main surfaces;

a plurality of electrode pads on one of the two main surfaces of the semiconductor chip, each of said electrode pads having a top face;

an insulation film on said one main surface of the semiconductor chip such that the top face of each of said electrode pads is exposed;

a rewiring pattern having a plurality of interconnects connected to said electrode pads respectively, and which extend over said insulation film;

a plurality of column-shaped electrodes connected to said plurality of interconnects, respectively and extending in a direction perpendicular to said one main surface, each of said column-shaped electrodes having a main body section connected to one of the interconnects and a protrusion section extending from said main body, section, each said protrusion section having a top face, said protrusion section having a cross-sectional diameter in a direction parallel to said one main surface that is smaller than a cross-sectional diameter of said main body section in the direction parallel to said one main surface;

a sealing section which is on said rewiring pattern and said insulation film, said sealing section buries said column-shaped electrodes and has a top face having a same height as the top faces of said protrusion sections of said column-shaped electrodes;

a plurality of trench sections in said sealing section, each of said trench sections having a depth from the top face of said sealing section to a boundary between said protrusion section and said main body section such that side faces of each said protrusion sections are exposed by said trench sections; and a plurality of solder balls, said solder balls being respectively over said protrusion sections such that said solder balls are respectively electrically connected with said column-shaped electrodes by being bonded to the top face and said side faces of said protrusion sections, wherein a cross-sectional shape of said protrusion section and a cross-sectional shape of said main body section in the direction parallel to said one main surface are respectively rectangular and circular.

5. A semiconductor device comprising:

a semiconductor chip having two main surfaces;

a plurality of electrode pads on one of the two main surfaces of the semiconductor chip, each of said electrode pads having a top face;

an insulation film on said one main surface of the semiconductor chip such that the top face of each of said electrode pads is exposed;

a rewiring pattern having a plurality of interconnects connected to said electrode pads respectively, and which extend over said insulation film;

a plurality of column-shaped electrodes connected to said plurality of interconnects, respectively and extending in a direction perpendicular to said one main surface, each of said column-shaped electrodes having a main body section connected to one of the interconnects and a protrusion section extending from said main body section, each said protrusion section having a top face, said protrusion section having a cross-sectional shape in a direction parallel to said one main surface that is different than a cross-sectional shape of said main body section in the direction parallel to said one main surface;

a sealing section which is on said rewiring pattern and said insulation film, said sealing section buries said column-shaped electrodes and has a top face having a same height as the top faces of said protrusion sections of said column-shaped electrodes;

a plurality of trench sections in said sealing section, each of said trench sections having a depth from the to face of said sealing section to a boundary between said protrusion section and said main body section such that side faces of each said protrusion sections are exposed by said trench sections; and a plurality of solder balls, said solder balls being respectively over said protrusion sections such that said solder balls are respectively electrically connected with said column-shaped electrodes by being bonded to the top face and said side faces of said protrusion sections, wherein the cross-sectional shape of said protrusion section is square and the cross-sectional shape of said main body section is circular.

6. A semiconductor device comprising:

a semiconductor chip having two main surfaces;

a plurality of electrode pads on one of the two main surfaces of the semiconductor chip, each of said electrode pads having a top face;

an insulation film on said one main surface of the semiconductor chip such that the top face of each of said electrode pads is exposed;

a rewiring pattern having a plurality of interconnects connected to said electrode pads respectively, and which extend over said insulation film;

a plurality of column-shaped electrodes connected to said plurality of interconnects, respectively and extending in a direction perpendicular to said one main surface, each of said column-shaped electrodes having a main body section connected to one of the interconnects and a protrusion section extending from said main body section, each said protrusion section having a top face, said protrusion section having a cross-sectional shape in a direction parallel to said one main surface that is different than a cross-sectional shape of said main body section in the direction parallel to said one main surface;

a sealing section which is on said rewiring pattern and said insulation film, said sealing section buries said column-shaped electrodes and has a top face having a same height as the top faces of said protrusion sections of said column-shaped electrodes;

a plurality of trench sections in said sealing section, each of said trench sections having a depth from the top face of said sealing section to a boundary between said protrusion section and said main body section such that side faces of each said protrusion sections are exposed by said trench sections; and a plurality of solder balls, said solder balls being respectively over said protrusion sections such that said solder balls are respectively electrically connected with said column-shaped electrodes by being bonded to the top face and said side faces of said protrusion sections, wherein the cross-sectional shape of said protrusion section is rectangular and the cross-sectional shape of said main body section is circular.

* * * * *